United States Patent

[11] 3,624,464

[72] Inventor Finis E. Gentry
Skaneateles, N.Y.
[21] Appl. No. 884,658
[22] Filed Dec. 12, 1969
[45] Patented Nov. 30, 1971
[73] Assignee General Electric Company

[54] PERIPHERAL GATE SCR WITH ANNULAR BALLAST SEGMENT FOR MORE UNIFORM TURN ON

3 Claims, 2 Drawing Figs.

[52] U.S. Cl. 317/234 R, 317/235 R, 317/235 AA, 317/235 AB, 25/586
[51] Int. Cl. H01l 3/00, H01l 5/00
[50] Field of Search 317/234, 235, 40, 41, 41.1; 29/586, 587, 588, 589

[56] References Cited

UNITED STATES PATENTS 3,435,515 4/1969 Kurpisz 317/235

FOREIGN PATENTS 1,007,952 10/1965 Great Britain 317/235
1,166,154 10/1969 Great Britain 317/235
1,555,029 12/1968 Great Britain 317/235

*Primary Examiner*—John W. Huckert
*Assistant Examiner*—Andrew J. James
*Attorneys*—Robert J. Mooney, Nathan J. Cornfeld, Carl O. Thomas, Frank L. Neuhauser, Oscar B. Waddell and Joseph B. Forman

ABSTRACT: An SCR is formed with a diffused region interposed between the gate and adjacent edge of the emitter layer to increase the lateral resistance offered to the gate signal and thereby assure more uniform conduction of the gate signal. The gate metallization shorts the adjacent edge of the junction associated with the diffused region, and the shorted edge is substantially uniformly spaced from the adjacent edge of the emitter layer so that the lateral resistance to signal current is substantially uniformly distributed.

Figure 1:
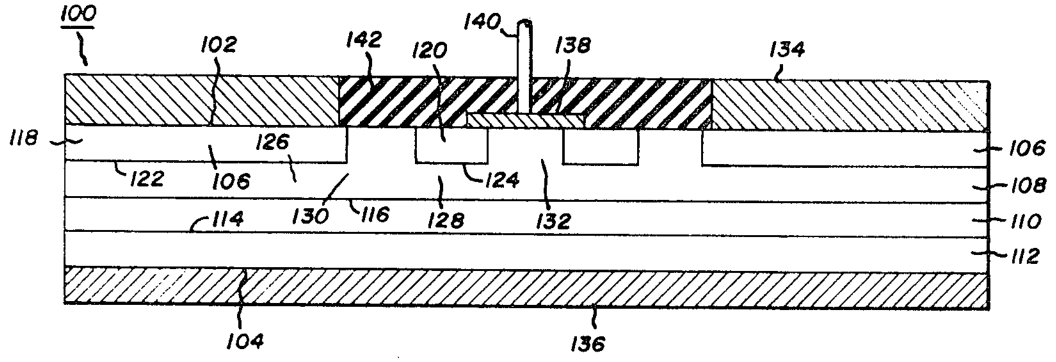

INVENTOR:
FINIS E. GENTRY,
BY Carl O. Thomas
HIS ATTORNEY.

PERIPHERAL GATE SCR WITH ANNULAR BALLAST SEGMENT FOR MORE UNIFORM TURN ON

My invention relates to a semiconductor controlled rectifier having an improved turn on capability.

The semiconductor-controlled rectifier or SCR is typically formed of a monocrystalline silicon pellet as its active element. The silicon crystal is formed into four sequential layers with adjacent layers being of opposite conductivity type so that P–N junctions are formed therebetween. The endmost layers are associated with main current carrying anode and cathode contacts and are referred to as emitter layers while the intermediate layers are referred to as base layers. The emitter layer of N type is ohmically associated with the cathode contact and is induced to inject electrons into the adjacent base layer to permit current conduction between the opposite contacts when the anode contact is biased positive with respect to the cathode contact and a gate signal is supplied. When the anode contact is biased negative with respect to the cathode contact or when no gate signal is provided, the silicon crystal under ordinary conditions of use provides a high-impedance current path therethrough due to junction reverse biasing.

I have observed that a common source of SCR failure is attributable to point turn on of the emitter layer in response to a gate signal. That is, only a very limited area of the emitter nearest the gate associated with the base layer may be turned on. If the initial area of turn on is not quickly spread laterally, a rapid increase of current flow from the anode contact to the cathode contact, as typically occurs at turn on, may produce an excessive current density which may cause localized overheating of the silicon crystal and device failure. Point turn on is believed to occur because a point or small area of the emitter junction once biased above its minimum conduction potential may conduct the gate signal to the emitter layer so readily through the turned on junction portion that a potential difference does not develop across the remaining portions of the emitter junction in excess of the conduction potential to allow full turn on. Point turn on tends to be particularly troublesome where only a weak gate signal is being used to fire or turn on the SCR. It also occurs where a portion of the emitter junction is positioned closer to the gate attachment than remaining portions of the junction. However, even where an attempt is made substantially uniformly to space the edge of the emitter junction from the gate, some portion of the emitter junction will always remain somewhat more preferential to turn on than other portions due to minute variances in spacing, geometry, resistivity etc.

Accordingly, it is an object of my invention to provide an SCR having an improved capability for uniform turn on, even when a weak gate signal is utilized.

According to one aspect, my invention is directed to an SCR having an improved ability to laterally distribute a gate signal comprised of a semiconductive element formed of four layers of one and the opposite conductivity type. The layers are interleaved with adjacent layers being of opposite conductivity type and forming a plurality of P–N junctions. The layers include a first endmost layer forming a first emitter layer and a first intermediate layer next adjacent thereto forming a first base layer. The first emitter layer includes a main segment and a gate ballast segment spaced laterally therefrom. The main segment forms a main emitter junction with the first base layer, and the gate ballast segment forms a ballast junction with the first base layer. The first base layer includes a main zone underlying the main segment, a ballast zone underlying the gate ballast segment, an intervening zone mediate the main and gate ballast segments, and a remote zone separated from the intervening zone by the gate ballast segment. The layers include a second endmost layer forming a second emitter layer. First and second major contacts are associated with the main segment and the second emitter layer, respectively. Gate means are associated with the remote zone and short an edge of the ballast junction adjacent thereto. The shorted edge of the ballast junction is substantially uniformly spaced from the main junction, and the gate ballast segment is of substantially uniform cross section and substantially uniformly constricts the ballast zone therebeneath.

Figure 2:
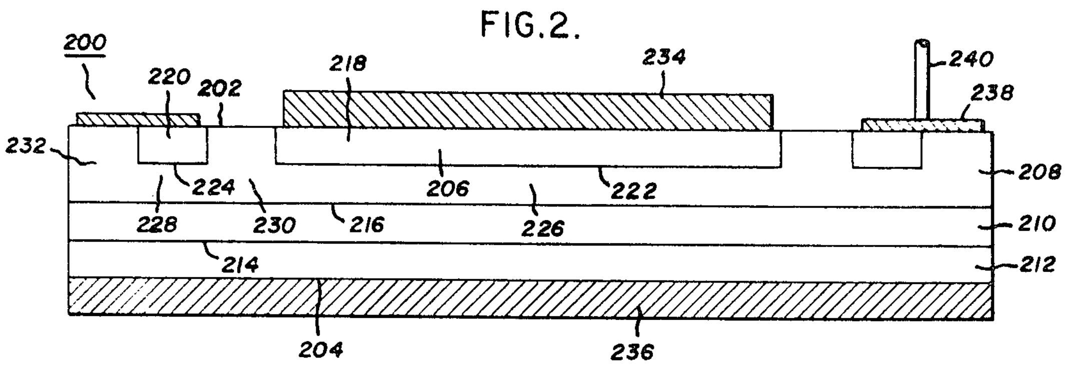

FIGS. 1 and 2 are schematic sectional views of SCR semiconductive elements with gate and main contacts associated therewith.

FIG. 1 representing a center gate embodiment of my invention and

FIG. 2 representing a ring gate embodiment thereof. Crosshatching is omitted from the sectioned semiconductive elements in order to avoid cluttering the drawings. The thickness of the semiconductive elements is greatly exaggerated in proportion to their width in order to allow the features thereof to be more easily appreciated. My invention may be best understood by considering the drawings in conjunction with the following detailed description.

In FIG. 1 a semiconductive element 100 is shown which may be monocrystalline silicon or any other conventional monocrystalline semiconductor material known to be useful in forming SCR's. The semiconductive element is provided with a first major surface 102 and a second, opposed major surface 104. The semiconductive element is formed with four sequentially arranged layers 106, 108, 110, and 112 extending from the first major surface to the second major surface. Layers 106 and 110 are of a first conductivity type while layers 108 and 112 are of an opposite conductivity type, so that a plurality of P–N junctions are formed therebetween. An emitter junction 114 is formed between the lower endmost emitter layer 112 and the base layer 110 adjacent thereto. A base junction 116 is formed between the base layers 110 and 108.

The emitter layer 106 adjacent the first major surface is divided into an annular main segment 118 and an annular gate ballast segment 120 concentrically positioned laterally inwardly thereof. The first base layer forms a main emitter junction 122 with the main emitter segment and a ballast junction 124 with the gate ballast segment. The first base layer includes a main zone 126 underlying the main segment. A ballast zone 128 underlies the gate ballast segment. An intervening zone 130 is interposed between the main segment and main zone on its outer edge and the gate ballast segment and ballast zone on its inner edge. A remote zone 132 lies interiorly of the ballast junction. As can be readily seen adjacent zones of the first base layer are integrally joined.

It is an essential feature of my invention that the gate ballast zone is of substantially uniform cross section and that the inner edge of the ballast junction is substantially uniformly spaced from the inner edge of the main emitter junction. As a result of this relationship the portion of the first base layer constricted in width by the gate ballast segment, that is, the ballast zone, is uniformly constricted and is of substantially uniform cross section. Similarly, the intervening zOne is of substantially uniform cross section throughout.

As used herein the term "substantially uniform" is merely intended to designate that degree of uniformity which is readily attainable in the art using known fabrication techniques, it being recognized that achieving absolute uniformity of the segments and zones is a practical impossibility. Alternately stated, the term substantially uniform as I apply it indicated a freedom from intentionally induced irregularities. It is, n fact, a key feature of my invention that minute variations in uniformity as are characteristic of even the most accurately controlled fabrication processes do not prevent obtaining the advantages of my invention.

A first major contact 134 overlies the main segment in ohmic conductive relation thereto. A second major contact 136 is similarly related to the emitter layer 112. A gate means including gate metallization 138 and gate lead 140 is positioned centrally of the first major surface. The gate metallization overlies the remote zone and the inner edge of the gate ballast segment shorting the inner edge of the ballast junction. While the contacts and gate metallization are shown as single layers, it is appreciated that they may be formed of one or a plurality of layers according to conventional practice. A dielectric body 142 is shown overlying and protecting the portion of the first major surface extending between the gate lead and the inner edge of the first major contact.

The fabrication of the combination shown in FIG. 1 may be readily achieved employing conventional techniques. According to a typical fabrication technique, the semiconductive element 100 may initially be formed of a conductivity type corresponding to that of base layer 110. Base layer 108 and emitter layer 112 may then be formed by simultaneous or sequential diffusion of an opposite conductivity type impurity. The emitter layer 106 may then be formed by alloying or masking the first major surface and diffusing in an impurity. Because of the high degree of accuracy with which junctions may be located formed by diffusion, I prefer that the gate ballast segment be formed by diffusion. For example, the accuracy with which the cross section of the ballast zone may be constricted by forming the gate ballast segment by diffusion greatly exceeds the accuracy of forming the gate ballast segment by alloying or, instead of forming a gate ballast segment, simply etching down from the first major surface in order to constrict the width of the ballast zone. While I prefer to constrict the ballast zone entirely by diffusion, it is contemplated that it may be desirable to first etch down from the first major surface and then to form the gate ballast segment by diffusion. In the most frequently employed SCR form the base layer 110 and emitter layer 106 are of N-type conductivity while the base layer 108 and emitter layer 112 are of P type conductivity. Accordingly, further description is with reference to this form of the SCR, although it is recognized that the conductivity types of the layers may be reversed without departing from my invention.

Where the environment ambient to the SCR is specially controlled to eliminate moisture and other contaminants, the combination shown in FIG. 1 may be employed as shown as an SCR. In most applications of use, however, it will be necessary to provide a protective housing of conventional construction in order to assure a practically acceptable life for the SCR. The combination shown, for example, may be encased in a passivant, such as glass and/or plastic or mounted in a hermetically sealed housing, as is well understood in the art. The housing choice forms no part of my invention.

In use, when the emitter layer 106 is of N-type conductivity and the first major contact 134 is biased positive with respect to the second major contact 136, the emitter junction 114 is reverse biased and no appreciable current flows through the semiconductive element between the major contacts. In such instance the SCR is reverse biased.

When the first major contact is biased negative with respect to the second major contact and no gate signal is supplied, the base junction 116 is reverse biased and, again, no appreciable current flows through the semiconductive element between the major contacts. In this instance, when the gate lead 140 is biased positive with respect to the first major contact, a gate signal is conducted from the gate metallization through the remote zone 132 of the first base layer 108, laterally beneath the gate ballast zone 120 through the constricted ballast zone 128, and laterally through the intervening zone 130 to the inner edge of the main segment 118 of the emitter layer to the first major contact. This causes electrons to be injected from the inner edge of the main segment into the inner edge of the main zone 126 so that conduction is initiated from the second major contact to the first major contact along the inner edge of the main segment. Conduction rapidly spreads laterally to turn on the entire main segment of the device. It is to be noted that the gate metallization shorts the inner edge of the ballast junction 124 and prevents charge injection from the gate ballast segment of the emitter layer, the gate ballast segment thus remaining passive at all times.

If the gate ballast segment 120 were omitted from the combination of FIG. 1, it is readily apparent that gate to cathode current tending to turn on the device would be conducted through the first base layer laterally to the inner edge of the main segment at or near the first major surface 102, since this is the shortest available conduction path through the first base layer and since, where the first base layer is formed by diffusion, the portion of the first base layer next adjacent the first major surface is of lowest resistivity. With such a low-resistivity path available to the gate signal it can be readily appreciated that should some point on the inner edge of the main segment be inadvertently more closely positioned to the edge of the gate metallization than remaining portions (or otherwise more readily turned on), this point would tend to selectively and preferentially receive the gate signal. This could occur because the forward conduction potential necessary to allow current to penetrate the main junction 122 would be first reached at this point. Further, once conduction was established at this point the low-resistance path between this point and the outer edge of the gate metallization would not allow additional potential buildup across the remaining portions of the main junction sufficient to establish a forward conduction potential across these portions of the junction, although some enlargement of the initial point of turn on may occur. As a result point turn on could readily occur in the absence of a strong gate signal.

By interposing the gate ballast segment between the outer edge of the gate metallization and the inner edge of the main segment, I force the gate signal current to follow a circuitous route therebeneath. Thus, the gate ballast segment creates an additional resistance to signal current in series with the inner edge of the main junction. This resistance is substantially uniformly laterally distributed in the form of the constricted cross section of the ballast zone. Further, signal current flow is deflected from the low-resistivity upper portion of the first base layer to the relatively higher resistivity central portion. This further contributes to increasing the series resistance to current flow.

Now, it is is again assumed that some portion of the inner edge of the main segment is inadvertently formed nearer the gate metallization, there is minimal tendency toward point turn on. Even though one point on the inner edge of the main segment may be turned on first, the additional resistance to gate signal current flow created by interposition of the gate ballast segment restrains such a preferential signal current flow through the turned on point of the main junction that the forward conduction potential for the remainder of the main junction cannot be reached. In other words, while some point on the inner edge of the main segment may still be instantaneously switched on first, this will not significantly impede turn on spreading uniformly over the entire inner edge of the main segment. Thus, the preferential channeling of the gate signal through an initially turned on point or limited area of he main segment of the emitter layer may not occur and excessive current densities and device failure are avoided. Instead, the gate signal is distributed more uniformly to the inner edge of the main segment and a more reliable and uniform turn on of the SCR results, even where weaker gate signals are employed.

While I have described my invention with reference to an SCR having a centrally positioned gate, it is appreciated that other conventional SCR configurations can be readily modified for incorporation of my invention. For example, in FIG. 2 a ring gate SCR is illustrated. The SCR includes a semiconductive element 200 having a first major surface 202 and a second major surface 204. The semiconductive element is provided with a first endmost emitter layer 206, an adjacent first base layer 208, a second base layer 210, and a second endmost emitter layer 212. The four sequentially arranged layers are of alternating conductivity type, so that an emitter junction 214 is formed between second emitter layer ad base layer 210, and a base junction 216 is formed between the base layers.

The first emitter layer is divided into a central main segment 218 and an annular gate ballast segment 220. A main junction 222 is formed between the main segment and the base layer 208 while a ballast junction 224 is formed between the ballast segment and base layer 208. The base layer 208 is formed of a main zone 226 underlying the main segment, an annular ballast zone underlying the ballast segment, an intervening zone 230 extending between the main and ballast zones, and a remote zone 232 separated from the intervening zone by the ballast zone. The various zones of the first base layer are integrally formed.

A first major contact 234 overlies the main segment while a second major contact 236 overlies the second emitter layer, An annular ring 238 of gate metallization is ohmically conductively associated with the remote zone of the first base layer and the adjacent edge of the gate ballast segment effectively shorting the outer edge of the ballast junction. Gate lead 240 is shown attached to the gate ring.

Except for the geometrical differences noted, the combination of FIG. 2 may be formed substantially identically as the center gate embodiment shown in FIG. 1 The use and advantages of the FIG. 2 combination are also essentially similar to those of the FIG. 1 embodiment. The principal difference is that instead of distributing the gate signal radially outwardly in a substantially uniform manner the gate signal is transmitted radially inwardly in a substantially uniform manner from the ring associated with the gate lead.

While I have described my invention with reference to certain preferred embodiments, it is appreciated that numerous modifications will readily occur to those skilled in the art. It is accordingly intended that the scope of my invention be determined by reference to the following claims.

What I claim and desire to secure by Letters Patent of the United States is:

1. A semiconductor controlled rectifier having an improved ability to laterally distribute a gate signal comprised of a semiconductive element formed of four layers of one and the opposite-conductivity type, said layer being interleaved with adjacent layers being of opposite conductivity type and forming a plurality of P–N junctions, said layers including a first emitter layer, said first emitter layer including a centrally located main segment and an annular gate ballast segment spaced laterally therefrom, a first base layer next adjacent to said first emitter layer, said main segment forming a central main emitter junction with said first base layer and said gate ballast segment forming an annular ballast junction with said first base layer, said first base layer including a main zone underlying said central main segment, a ballast zone underlying said annular gate ballast segment, and annular intervening zone mediate said main and gate ballast segments, and a peripheral remote zone separated from said intervening zone by said gate ballast segment, said layers including a second endmost layer forming a second emitter layer, first and second major contacts associated with said central main segment and said second emitter layer, respectively, annular gate means associated with said peripheral remote zone shorting an external edge of said ballast junction adjacent thereto and spaced outwardly from an inner edge of said junction, said shorted edge of said ballast junction being substantially uniformly spaced from said central main junction, and said annular ballast zone being of substantially uniform cross section.

2. A semiconductor controlled rectifier according to claim 1 in which said gate ballast segment is a diffused layer.

3. A semiconductor controlled rectifier according to claim 1 in which said first base layer is of graded resistivity, said resistivity being at a minimum adjacent said first major surface.

* * * * *